(12) United States Patent
Stuetzel et al.

(10) Patent No.: US 9,096,922 B2
(45) Date of Patent: Aug. 4, 2015

(54) SILICON LAYERS FORMED FROM POLYMER-MODIFIED LIQUID SILANE FORMULATIONS

(75) Inventors: Bernhard Stuetzel, Marl (DE); Matthias Patz, Bottrop (DE)

(73) Assignee: Evonik Degussa GmbH, Essen (DE)

( * ) Notice: Subject to any disclaimer, the term of this patent is extended or adjusted under 35 U.S.C. 154(b) by 54 days.

(21) Appl. No.: 13/503,668

(22) PCT Filed: Oct. 18, 2010

(86) PCT No.: PCT/EP2010/065598
§ 371 (c)(1),
(2), (4) Date: Apr. 24, 2012

(87) PCT Pub. No.: WO2011/061029
PCT Pub. Date: May 26, 2011

(65) Prior Publication Data
US 2012/0205654 A1    Aug. 16, 2012

(30) Foreign Application Priority Data

Nov. 18, 2009  (DE) .......................... 10 2009 053 805

(51) Int. Cl.
| | |
|---|---|
| H01L 29/04 | (2006.01) |
| H01L 31/20 | (2006.01) |
| H01L 31/036 | (2006.01) |
| H01L 31/0376 | (2006.01) |
| H01L 29/12 | (2006.01) |
| H01L 31/0312 | (2006.01) |
| H01L 29/76 | (2006.01) |
| H01L 29/94 | (2006.01) |

(Continued)

(52) U.S. Cl.
CPC ........... *C23C 18/1204* (2013.01); *C23C 18/122* (2013.01); *C23C 18/14* (2013.01); *H01L 21/0242* (2013.01); *H01L 21/02532* (2013.01); *H01L 21/02576* (2013.01); *H01L 21/02579* (2013.01); *H01L 21/02628* (2013.01)

(58) Field of Classification Search
CPC ............ H01L 31/202; H01L 29/78675; H01L 29/1608; H01L 29/66068; H01L 29/1602; H01L 29/7802; H01L 29/6606
USPC ........ 257/52, 65, 77, 381, E51.046, E29.289, 257/E21.151; 423/342, 347; 428/405, 429
See application file for complete search history.

(56) References Cited

U.S. PATENT DOCUMENTS 6,514,801 B1   2/2003  Yudasaka et al.
2003/0045632 A1   3/2003  Shiho et al.
(Continued)

FOREIGN PATENT DOCUMENTS

| CN | 1297581 A | 5/2001 |
|---|---|---|
| EP | 1 284 306 | 2/2003 |

OTHER PUBLICATIONS

U.S. Appl. No. 13/807,852, filed Dec. 31, 2012, Stuetzel, et al.
(Continued)

*Primary Examiner* — A. Sefer
*Assistant Examiner* — Dilinh Nguyen
(74) *Attorney, Agent, or Firm* — Oblon, McClelland, Maier & Neustadt, L.L.P.

(57) ABSTRACT

The invention relates to a formulation which contains at least one silane and at least one carbon polymer in a solvent, and to the production of a silicon layer on a substrate which is coated with such a formulation.

12 Claims, 6 Drawing Sheets

(51) Int. Cl.
*H01L 31/062* (2012.01)
*H01L 31/113* (2006.01)
*H01L 31/119* (2006.01)
*C23C 18/12* (2006.01)
*C23C 18/14* (2006.01)
*H01L 21/02* (2006.01)

(56) References Cited

U.S. PATENT DOCUMENTS

| | | |
|---|---|---|
| 2006/0185712 A1 | 8/2006 | Shiho et al. |
| 2009/0155454 A1 | 6/2009 | Masuda et al. |
| 2009/0189510 A1* | 7/2009 | Kanamori et al. ............ 313/498 |
| 2010/0222477 A1* | 9/2010 | Tsukamoto et al. .......... 524/195 |
| 2010/0330478 A1* | 12/2010 | Wu ............................... 430/58.8 |
| 2011/0189072 A1 | 8/2011 | Brausch et al. |
| 2012/0042951 A1 | 2/2012 | Stuetzel et al. |
| 2012/0199832 A1 | 8/2012 | Stuetzel et al. |
| 2013/0168824 A1 | 7/2013 | Wieber et al. |

OTHER PUBLICATIONS

U.S. Appl. No. 13/989,823, filed May 28, 2013, Wieber, et al.
U.S. Appl. No. 13/824,641, filed Mar. 18, 2013, Wieber, et al.
U.S. Appl. No. 13/991,261, filed Jun. 3, 2013, Stenner, et al.
U.S. Appl. No. 13/885,316, filed May 14, 2013, Stenner, et al.
U.S. Appl. No. 13/991,986, filed Jun. 6, 2013, Brausch, et al.
U.S. Appl. No. 13/510,373, filed May 17, 2012, Wieber, et al.
U.S. Appl. No. 13/504,331, filed Apr. 26, 2012, Wieber, et al.
Shimoda, T., et al., "Solution-processed silicon films and transistors," Nature, vol. 440, pp. 783-786, (Apr. 6, 2006).
Tanaka, H., et al., "Spin-on n-Type Silicon Films Using Phosphorous-doped Polysilanes," Japanese Journal of Applied Physics, vol. 46, No. 36, pp. L886-L888, (2007).
Schulz, D.L., et al., "$Si_6H_{12}$/Polymer Inks for Electrospinning a-Si Nanowire Lithium Ion Battery Anodes," Electrochemical and Solid-State Letters, vol. 13, No. 10, pp. A143-A145, (Aug. 4, 2010).
International Search Report Issued Jul. 11, 2011 in PCT/EP10/65598 Filed Oct. 18, 2010.
U.S. Appl. No. 13/574,376, filed Jul. 20, 2012, Wieber, et al.

* cited by examiner

SILICON LAYERS FORMED FROM POLYMER-MODIFIED LIQUID SILANE FORMULATIONS

CROSS-REFERENCE TO RELATED APPLICATIONS

This application is a National Stage entry under 35 USC 371 of PCT/EP10/065,598, filed on Oct. 18, 2010, and claims priority to German Patent Application No. 10 2009 053 805.4, filed on Nov. 18, 2009.

BACKGROUND OF THE INVENTION

1. Field of the Invention

The invention relates to a formulation which comprises at least one silane and at least one carbon polymer, and to the production of a silicon layer on a substrate which is coated with such a formulation.

2. Description of the Related Art

The conventional production of solar cells consists either in the opposite doping of a doped semiconductor substrate by means of implantation or diffusion, in the deposition of an oppositely doped semiconductor layer on a doped semiconductor substrate by means of epitaxy, or in the deposition of semiconductor layers of different doping from the gas phase under reduced pressure. The processes mentioned are also employed in variants.

The disadvantage of established processes is the level of complexity which is necessary owing to the need for vacuum technology, high temperatures and/or substrates prepared at great cost and inconvenience. To avoid this complexity, cost and inconvenience, attempts are being made to produce semiconductive or photovoltaically active layers or layer sequences from liquid silanes.

Silanes can be deposited from the liquid phase thereof by means of a spin-coater. The layers obtained therefrom can be stabilized by a suitable thermal treatment, such that they typically comprise a mixture of microcrystalline, nanocrystalline and amorphous structures. Such microcrystalline, nanocrystalline and/or amorphous layers are referred to here and hereinafter as 'polymorphic'. An exact distinction and definition of the crystalline structure of polymorphic layers is not possible with accuracy in most cases, or is of minor importance for the intended applications.

The way in which silicon layers are produced from silanes is known to those skilled in the art. For instance, GB 2077710 teaches the preparation of polysilanes of the general formula $-(SiH_2)_n-$ where $n \geq 10$ by simultaneous reduction and polymerization of $SiH_2Cl_2$ with alkali metals.

Such higher silanes are used as precursors for silicon layers, for example for solar cells. In the case of the silanes $Si_nH_{2n+2}$ with relatively small values for n, namely $n \leq 4$, JP 7267621 teaches the production of silicon layers from films of such silanes, which are first irradiated with UV light under cold conditions and then heated to temperatures above 400° C. EP 1 284 306 discloses that silicon films can be produced in a similar manner from cyclic silanes of the general formula $Si_nH_{2n}$, and open-chain silanes of the general formula $Si_nH_{2n+2}$, each where $3 \leq n \leq 10$.

These silanes are partly or fully oligomerized, for example by heating and/or UV irradiation. In addition, specific phosphorus compounds or boron compounds are added in order to achieve n- or p-doping.

The above-described production of such layers and the layers themselves have considerable defects. Firstly, the liquid silane compounds, alone or in formulated solution, have an extremely low polarity. The result of this is that the spread of a film composed of such formulations in the coating operation is poor and the films contract after the shear by the application unit has ended. This makes the coating outcome fully or partly reversible even at the wet film stage, and the result is incompletely covered substrates, for example with a leopardskin structure consisting of covered and uncovered regions. It is possible to counteract these film defects to a small degree by reducing the silane content in the formulation and/or by higher shear, for example high speed of the spin-coater. However, such measures lead to thin films, and it is barely possible to exceed film thicknesses of 100 nm.

A certain improvement in film formation and a reduction in the contraction effect of the films is also achieved by the oligomerization of the liquid silanes or by dissolution of silane oligomers in the liquid formulations. However, these measures are limited by the fact that oligomeric silanes of relatively high molar masses are insoluble in the low molecular weight silanes and in the solvents added thereto and, for example according to EP 1 284 306, only about 10 percent by weight of oligomers are soluble in the liquid silane formulation. Since the silane oligomers have a low polarity and must not have a very high molecular weight in order still to dissolve in the low molecular weight silane, only minor improvements can be achieved in this way. The trend towards incompletely covered substrates is therefore maintained.

Relatively high layer thicknesses of 1 to 3 µm are advantageous in particular for the lower layer of a solar cell, known as the base layer. Thicker layers of liquid silanes are achieved by means of relatively high-viscosity formulations and/or the buildup of multiple layers. In the case of buildup of multiple layers by repeated coating, however, the problem of inadequate coating of the substrate remains. Although there is a certain probability of covering previously uncovered regions by repeated coating steps, the multiple layers then achieved have significant thickness variations. Moreover, these are not reproducible owing to random results of such processes.

On silicon as the substrate, liquid silane-based silicon layers are achievable without any problems. However, it is not possible according to the prior art to obtain a first coherent silicon layer on a suitable substrate in order then to be able to add on the further layers more easily. It is therefore not possible to produce solar cells on the basis of a sequence of thin polymorphic silicon layers by means of spin-on deposition or a similar process. It is thus not possible to achieve a layer structure which is capable of absorbing sufficient sunlight.

The procedure outlined above also does not allow the layer to be provided with a structure. Structuring of the layer is desirable since light absorption can be increased not only by virtue of the layer thickness itself, but also by virtue of structuring of the silicon layers. Light can be refracted many times by edges and recesses, which are equivalent to refractive index contrasts, which leads to lengthening of the light path in the photovoltaically active medium. There is thus effectively more light available for the photovoltaic operation. Structuring can be achieved in conventional wafer or CVD processes, for example by roughening the layer surfaces by means of etching processes, but are not achievable in a simple manner on liquid silane-based silicon layers.

In summary, it can be stated that it has not been possible to date in the prior art to obtain, from spread liquid silanes, silicon layers which completely cover the substrate, are structurable like the layers obtained from conventional wafer or CVD processes, and in addition have thicknesses which are already usable for photovoltaic applications when the liquid silanes are applied only once to the substrate.

BRIEF SUMMARY OF THE INVENTION

It was thus an object of the present invention to provide a liquid silane formulation from which polymorphic silicon layers are obtained on various substrates. More particularly, the silicon layer should already be complete, structurable and dopable after single application of the liquid silane formulation.

This object is surprisingly achieved by adding to the liquid silane formulation one or more high molecular weight carbon polymers which react with the silane present therein.

DETAILED DESCRIPTION OF THE INVENTION

The present invention thus provides a liquid silane formulation containing at least one reaction product (A) of at least one silane
    selected from silane of the general formula $Si_nR_{2n+2}$ and/or $Si_nR_{2n}$, and (B) of at least one high molecular weight carbon polymer miscible with component (A) in a proportion of 0.001 to 15% by weight, based on the mass of silicon in component (A).

Here and hereinafter, a high molecular weight carbon polymer is understood to mean a carbon polymer which has a weight-average molecular weight $M_w$ of greater than 5000 g/mol. The values for $M_w$ may be up to 10 000 000 g/mol. An upper limit arises from the miscibility of the carbon polymer with component (A) and the nature of the carbon polymer.

The inventive liquid silane formulation has the advantage of exhibiting better spreading on substrates customary in the prior art for photovoltaic and/or solar technology applications than is observed with conventional formulations.

The inventive liquid silane formulation also has the advantage that formation of a coherent and additionally structured layer is achieved with the addition of the high molecular weight carbon polymer(s) in the coating of a substrate. Additional structuring steps required in the prior art in order to achieve photovoltaic cells with a useful energy yield of incident sunlight are superfluous when the inventive formulation is employed.

The present invention therefore likewise provides a process for producing a silicon layer on a substrate, comprising the steps of
(a) providing an inventive liquid silane formulation,
(b) applying this liquid silane formulation to the substrate,
(c) introducing electromagnetic and/or thermal energy, which decomposes the high molecular weight carbon polymer(s) at least partly to monomers and drives these monomers at least partly out of the liquid silane formulation to obtain an at least partly polymorphic silicon layer.

The process according to the invention affords silicon layers which, compared to the significantly more complex CVD and PECVD processes, for comparable usability of the results in photovoltaics or solar technology, complete coverage of the substrates which can be achieved only with difficulty in the prior art with silane-based coatings.

The inventive formulation exhibits improved applicability in the performance of the process according to the invention. In the performance of this process, better adhesion of the finished silicon layer on the substrate and a higher thickness of the polymorphic silicon layer are therefore also obtained.

Likewise provided, therefore, is a silicon layer which is obtained by the process according to the invention.

The inventive liquid silane formulation and the process according to the invention are explained in detail hereinafter.

Component (A) of the inventive liquid silane formulation may preferably be selected from 3≤n≤1000, and/or R=H, halogen, organyl, the R radical of the silane or of the silanes being the same or different.

In one variant of the inventive liquid silane formulation, the reaction product may comprise at least one higher silane with the general formula $Si_nH_{2n+2}$ where 3≤n≤10, preferably 4≤n≤8, and/or $Si_nH_{2n}$ where 4≤n≤8, preferably where n=5 or 6. By means of UV irradiation or introduction of thermal energy into the inventive formulation, it is also possible to obtain higher silanes of the aforementioned formulae where n≥3. In this way, it is possible to obtain, from an inventive low-viscosity liquid silane formulation, an inventive higher-viscosity liquid silane formulation in a simple manner.

If silanes in the inventive formulation are converted by means of UV irradiation or introduction of thermal energy to higher silanes, these reaction products preferably have molar masses of 200 g/mol to 10 000 g/mol, more preferably of 800 to 5 000 g/mol and most preferably of 500 to 3 000 g/mol. However, the utility of inventive liquid silane formulations containing such reaction products is limited, since higher silanes tend to precipitate out of the liquid formulation even though the viscosity of the formulation rises with n. Such silanes are thus no longer soluble, and the formulation is no longer usable for the coating of substrates. Instead of influencing the viscosity via n, however, it is likewise possible to control the viscosity over a wide range by means of component (B).

When non-liquid silanes are used, they may be dissolved in the inventive formulation in a further component (C), at least one solvent which is selected from room temperature liquid hydrocarbons. The solvent (C) may at the same time serve for dissolution of component (B) and for solubilization between component (A) and (B).

Particular preference is given to selecting aliphatic and/or aromatic hydrocarbons; very particular preference is given to selecting hexane, heptane, octane, nonane, decane, toluene, mesitylene, cyclooctane. Very particular preference is given to cyclooctane. The viscosity of the liquid silane formulation claimed is also adjustable with the proportion of component (C). The viscosity of the inventive liquid silane formulation, which is adjusted by means of n and/or the proportion of component (B) and/or (C), is preferably within the range from 200 to 20 000 mPas and more preferably from 500 to 10 000 mPas. The inventive formulation may have such viscosities when the carbon polymers have molecular weights of 5 000 g/mol to 10 000 000 g/mol. According to the known dependence of the viscosity increase with rising molecular weight, the higher the molecular weight of the carbon polymer, the smaller the amount of this polymer can be added.

It may be advantageous when component (B) of the inventive liquid silane formulation is selected from copolymers and/or linear polymers with —C—C-bonds, rings, heteroatoms and/or heterocycles in the main chain, or a combination of these polymers, these polymers having subgroups, selected from unsaturated polymers, polyacrylates, methacrylates, polyvinyls, polyvinyl ketones, polyvinyl ethers, polystyrenes, or a mixture of these polymers and/or copolymers.

Preference is given to carbon polymers with molecular weights of 5 000 to 5 000 000 g/mol, more preferably with molecular weights of 20 000 to 1 000 000 g/mol, since this is the range of industrially readily available carbon polymers.

Particular preference is given to selecting polymers which decompose substantially to monomers and/or volatile fragments in the course of performance of the process according to the invention as a result of introduction of the energy needed to convert the silane or the silanes, meaning that the fragments thereof, in the course of thermal decomposition, have very substantially escaped, just like the solvents used, from the inventive silicon layer or that obtained in accordance with the invention.

Particular preference is given to selecting (B) from linear polymers with —C—C-bonds in the main chain (main-chain acyclic carbon polymers), with the subgroups of unsaturated polymers, e.g. polybutadiene, polyisoprene, of saturated polymers, e.g. polyalkenes, e.g. polyisobutene, polyacrylates, e.g. polymethyl acrylate, polyethyl acrylate, polybutyl acrylate, polymethyl methacrylate, polyethyl methacrylate, polyisopropyl methacrylate, polybutyl methacrylate, polyvinyls, e.g. polyvinyl acetate, polyvinyl ketones and polyvinyl ethers, e.g. polymethyl vinyl ketone, polystyrenes, e.g. polystyrene, poly-alpha-methylstyrene.

In addition, (B) may preferably be selected from polymers with rings in the main chain (main-chain carbocyclic polymers), e.g. poly-(1,4)-phenylenemethylene, polymers with heteroatoms in the main chain with the subgroups, for example polyethers, poly(oxyethylene), and also polyesters, e.g. polyethylene terephthalate, polycarbonates, e.g. poly(oxycarbonyloxy-1,3-phenylene), polyanhydrides, polysulphides and polysulphones, polyamides, e.g. nylon 6, polysiloxanes and/or polyurethanes, and additionally polymers with heterocycles in the main chain, e.g. phenol-formaldehyde resins.

All conceivable copolymers, mixtures of polymers and further polymers not mentioned in the list are also advantageous, provided that they are high in molecular weight and thermally decomposable.

A selection of polymers which includes this selection and can be selected in the inventive formulation can be found, for example, in J. Brandrup and E. H. Immergut in the POLYMER HANDBOOK, 3rd Edition 1989, John Wiley & Sons, publishers, on pages II 365-II 386.

The inventive liquid silane formulation comprises component (B) with a proportion of 0.001 to 15% by weight, based on the mass of silicon in component (A). Preferably, (B) may be present in a proportion of 0.01 to 10.0% by weight. The higher the molecular weight of component (B), the lower the proportion thereof may be.

Very particularly preferred compositions arise from a maximum increase in viscosity with simultaneous complete decomposition of the polymer in the silane conversion.

The inventive liquid silane formulation may contain at least one further component (D) dopant. Preferred dopants are phosphorus or boron compounds, in order to achieve n- or p-doping in the inventive silicon layer or that obtained in accordance with the invention.

The present invention likewise provides a process for producing a silicon layer on a substrate, comprising the steps of
  (a) providing an inventive liquid silane formulation,
  (b) applying this liquid silane formulation to the substrate,
  (c) introducing electromagnetic and/or thermal energy, which decomposes the high molecular weight carbon polymer(s) at least partly to monomers and drives these monomers at least partly out of the liquid silane formulation to obtain an at least partly polymorphic silicon layer.

The process according to the invention is less complex compared to the conventional thin-layer processes, for example chemical vapour deposition (CVD) and plasma-enhanced CVD (PECVD) processes. In these processes, silicon-containing gases are decomposed to silicon in vacuum chambers. The process according to the invention does not need any vacuum technology at all.

When an inventive liquid silane formulation comprising oligomeric silanes is provided in step (a), it is advantageous that, in step (b) of the process according to the invention, a wet film is obtained, which completely covers the substrate without any need, as required in the prior art, for reprocessing or multiple coating or complex preparation of the substrate before the coating. A further advantage when the formulation provided in accordance with the invention comprises oligomeric silanes is that these silanes do not evaporate as readily during the performance of step (c). In addition, layers which better cover the substrate are obtained, meaning therefore that the substrate, even after single performance of the process claimed, has complete coverage with polymorphic silicon.

Preference is given to silanes which have been partly or fully oligomerized in the reaction product of the inventive formulation before step (a), preferred molar masses being from 200 g/mol to 10 000 g/mol, more preferably 500 g/mol to 5 000 g/mol.

The process according to the invention is suitable for all substrates in semiconductor wafer technology, including for the surfaces of substrates comprising metals, metal alloys, graphite, conductive carbon compounds, or other conductive objects, for example metal flakes in a carbon matrix, or insulators, for example glass or ceramic, coated with a conductive material, or thermally stable plastics. In the case of the insulators with conductive coating, it should be noted that the later coverage of the substrate with the silicon layer must not be over the complete surface, in order that a conductive connection is maintained at the side, for example for current discharge.

The carbon polymers of the liquid silane formulation provided in step (a) of the process according to the invention may preferably be selected from copolymers and/or linear polymers with —C—C-bonds, rings, heteroatoms and/or heterocycles in the main chain.

It may also be advantageous to select a combination of these polymers which have subgroups selected from saturated polymers, polyacrylates, methacrylates, polyvinyls, polyvinyl ketones, polyvinyl ethers, polystyrenes, copolymers of these subgroups, or a mixture of these polymers and/or copolymers.

When the abovementioned polymers and/or copolymers are selected, the process has the advantage that these polymers and/or copolymers can decompose during the performance of step (c) to volatile monomers, for example by pyrolysis or thermal decomposition. The monomers for the most part evaporate out of the inventive silicon layer or that obtained in accordance with the invention and/or are driven out by the input of energy.

Particular preference is given to polymers which disappear substantially without residue via depolymerization or some other decomposition into volatile fragments which is known to those skilled in the art. The residues of volatile fragments are preferably less than 0.1% by weight, based on the weight of the overall layer. Possible residues of solids, for example pyrolysis residues in the decomposition of the polymers, which consists predominantly of carbon, are preferably less than 1% by weight, based on the weight of the overall layer. The electronic properties are more preferably impaired only insignificantly, if at all, by the residues.

The improvements achieved by the process according to the invention in the applicability of liquid silanes or those dissolved in solvent, in the adhesion of the finished silicon layer on the substrate, in the desired layer structure in the case of differently doped sections in the semiconductor, and in the structurability in the case of coating of a substrate are achieved by virtue of the high molecular weight carbon polymer(s).

In a further particularly preferred embodiment of the process according to the invention, addition polymers of unsaturated ethylenic monomers can be used as high molecular weight carbon polymers in the liquid silane formulation of step (a). These polymers decompose readily and leave principally monomers thereof as fragments. Polymers usable with very particular preference are polymethyl methacrylate, polystyrene, poly-alpha-methylstyrene, copolymers thereof, and/or mixtures of these carbon polymers. Exceptionally preferred are polymers which consist only of carbon and hydrogen, for example polystyrene and poly-alpha-methylstyrene and copolymers thereof.

The carbon polymers provided in step (a) with the inventive liquid silane formulation are preferably high in molecular weight, in order to achieve a significant increase in viscosity of the coating formulation even in a small amount. Preferred molecular weights are in the range from $M_w$=5 000 to 5 000 000 g/mol, more preferably from $M_w$=20 000 to 1 000 000 g/mol.

The amount of the carbon polymers used with the provision of the inventive formulation may be from 0.001 to 15% by weight, based on the proportion of pure silicon in this formulation. The amount of carbon polymers used is preferably from 0.01 to 10% by weight.

In a further embodiment of the process according to the invention, step (a) may be followed by addition of solvents, dopants and/or further assistants during and/or after step (b). For example, dopants can be introduced by means of polymeric dopant formulations by adding such substances to the inventive liquid silane formulation or, after step (b), interrupting step (c) at low energy input, preferably 200° C. in the case of thermal energy input, cooling and then applying such dopant formulations, preferably via spin-coating, and then continuing energy input until the decomposition of the carbon polymers. Suitable dopant formulations are, for example, phosphorus- or boron-modified silane polymers or phosphorus- or boron-modified carbon polymers. The proportion of solvent, based on the amount which was applied to the substrate at the start of performance of step (c), may be from 5 to 93% by weight, preferably from 20 to 80% by weight, more preferably from 35 to 75% by weight.

The inventive liquid silane formulation can be applied to the substrate in step (b), or liquid substances or substance mixtures can be applied before performance of step (c), in a manner known to those skilled in the art. Preference is given to casting, spin-on deposition, atomization from liquid phase, knife-coating and/or roll-coating. The application in step (b) can more preferably be effected by means of spin-on deposition.

In the process according to the invention, after performance of step (b), a wet film is obtained, which is referred to as such here and hereinafter, and which fully covers the surface of the substrate on which the inventive liquid silane formulation has been applied.

It is an advantage of the process according to the invention and of the inventive liquid silane formulation that the wet film obtained after step (b) gives better wetting of the substrate.

During the performance of step (c), the carbon polymers for the most part pyrolysed to monomers as the result of the input of electromagnetic and/or thermal energy and are for the most part driven out of the wet film. At the same time, the silane or the silanes are converted to silicon in step (c). These operations convert the wet film to an at least partly polymorphic silicon layer.

The introduction of electromagnetic and/or thermal energy in step (c) of the process according to the invention can be effected in a manner known to those skilled in the art. Preferably, the substrate with the wet film obtained after step (b) can be heated to a temperature of 300 to 1000° C., preferably of 400 to 950° C.

After step (c), the at least partly polymorphic silicon layer which has small proportions of carbon and/or carbon-rich pyrolysis products is obtained.

It is a further advantage of the process according to the invention that the film obtained after step (c) has an at least partly polymorphic silicon layer and improved adhesion on the substrate.

In a further preferred embodiment of the process according to the invention, the silicon layer obtained after step (c) can be sent to a thermal treatment without irradiation.

During step (c) and/or after this step, the thermal energy can be introduced by means of hotplates, infrared fields, tubular furnaces, muffle furnaces, or a combination of these heat sources. The temperatures set are more preferably from 300 to 1000° C. Particular preference is additionally given to introducing thermal and/or electromagnetic energy with exclusion of atmospheric oxygen and/or water.

The silicon layer obtained after step (c), in a further step (d), can preferably be heated under a forming gas to a temperature of 300 to 1000° C., more preferably of 350 to 800° C., most preferably 400 to 700° C., and then cooled. Such treatments can improve the quality of the silicon layer.

It may be advantageous to use, as the forming gas, hydrogen, nitrogen, argon or a mixture of these gases, preferably $H_2/N_2$ and/or $H_2/Ar$. The preferred volume ratio in the case of binary forming gas mixtures may be from 5/95 to 10/90.

Steps (a) to (c) of the process according to the invention can be repeated as often as necessary, preferably with a different or zero dopant content of the formulation provided in step (a) for each repetition. It is thus also possible to obtain a plurality of silicon layers, more preferably with different doping, on one substrate.

The carbon polymers of the inventive liquid silane formulation, apart from increasing the viscosity of the formulation, also surprisingly cause structuring of the silicon layer obtained after performance of the process according to the invention. Accordingly, no separate industrial steps are needed for such structuring. The crater-like structures, owing to the refractive index achieved with the edges, cause contrasts between the crater-like structure and the silicon layer volume as a light collector. Given a suitable substrate, the inventive silicon layer is thus usable for photovoltaic applications directly after the last step in the process according to the invention. Incident light is scattered many times on the crater-like structures, and the silicon layer therefore offers more surface area to the light. This improves the photovoltaic effect.

The present invention therefore also provides a silicon layer producible by the processes according to the invention, which has crater-like structures and is complete if the silicon layer has a mean thickness of greater than or equal to 10 nm.

The inventive silicon layer preferably has a thickness of 20 nm to 4 μm. A crater-like structure is understood in the context of the present invention to mean a predominantly circular and/or elliptical depression which does not reach down to the surface of the substrate coated by the process according to the invention. The inventive silicon layer preferably has crater-like structures with diameters of 0.5 to 5 μm.

For the production, for example, of a solar cell, at least one pn junction is needed. This can be achieved with 2 layers, in which case one inventive silicon layer has n-doping, and the other p-doping. A plurality of inventive silicon layers are likewise obtainable, more preferably silicon layers, of which at least one silicon layer is undoped (i-Si layer).

The invention therefore also provides a light-sensitive element which has at least one inventive silicon layer, and an electronic component which comprises the inventive light-sensitive element.

Preferred electronic components are photovoltaic elements, solar cells, tandem solar cells, photodiodes, suppressor diodes, light-sensitive transistors, varistors, thyristors, electronic or mechatronic circuits or arrangements comprising solar cells, electronic instruments, for example control mechatronics of solar power plants.

The invention is illustrated hereinafter by examples.

Comparative Example 1

In a glovebox with an argon atmosphere which had an oxygen concentration below 0.5 ppm and a water content of not more than 0.5 ppm, 5 g of cyclopentasilane in an open vessel were irradiated with a UV lamp of wavelength 254 nm and a power of 15 watts at a distance of 6 cm over a period of 15 min. In the course of this, the mobile silane became more viscous.

Gel permeation chromatography (GPC) with the aid of a polystyrene calibration curve was used to determine the weight-average molecular weight of the relatively high molecular weight proportion to be Mw=2400 g/mol.

In addition, the mixture also contained residues of monomeric cyclopentasilane. The mixture was diluted with toluene such that the mixture consists of one part by weight of silane and 3 parts by weight of toluene, and is applied with the aid of a spin-coater onto a pre-cleaned quartz blank of size 2.5 cm·2.5 cm. Subsequently, a hotplate was used to heat the layer to 500° C. for a duration of 2 min. The result was a dark silicon layer which covered the glass blank only to an extent of about 70% owing to contraction of the wet layer obtained after the spin-coating.

This layer was subjected to heat treatment at 950° C. in a furnace under inert gas over the course of 30 min. The layer thickness, measured with a profilometer, KLA Tencor, instrument type P15 from KLA-Tencor Corporation, Film and Surface Technology, 160 Rio Robles, San Jose, Calif. USA 951 34, was 190 nm. The specific ohmic resistivity was measured by means of the 4-point method with a Keithley 2400 source meter and was above $10^7$ Ω·cm.

Comparative Example 2

Comparative example 1 was carried out, but with the difference that a cooligomer of phenylphosphine and cyclopentasilane having a weight-average molecular weight Mw=2200 g/mol was added as a dopant together with the toluene on dilution of the mixture of oligomeric and monomeric cyclopentasilane produced by UV irradiation.

The liquid formulation thus obtained was subsequently applied with the aid of a spin-coater to a pre-cleaned quartz blank of size 2.5 cm·2.5 cm, and the wet layer thus obtained on the quartz blank was heated to 500° C. with the aid of a hotplate. This resulted in a dark silicon layer which covered the blank to an extent of about 60%. At the edges and in the middle, the blank had uncovered areas which formed as a result of contraction of the wet layer after coating.

The dark silicon layer was subjected to heat treatment at 950° C. in a furnace under inert gas for 30 min. The layer thickness and the specific ohmic resistivity of this layer were measured as in comparative example 1. The thickness was 180 nm, and the specific ohmic resistivity was 25 Ω·cm.

Comparative Example 3

Comparative example 1 was carried out, but with the difference that a cooligomer of decaborane (14) and cyclopentasilane with a weight-average molecular weight Mw=2500 g/mol was added as a dopant together with the toluene on dilution of the mixture of oligomeric and monomeric cyclopentasilane produced by UV irradiation.

The solution was subsequently applied with the aid of a spin-coater to a pre-cleaned quartz blank of size 2.5 cm·2.5 cm, and the layer was heated to 500° C. with the aid of a hotplate. The result was a dark silicon layer which covered the glass blank to an extent of about 60%. At the edges and in the middle, the blank had uncovered areas which formed as a result of contraction of the wet layer after the coating.

The silicon layer was subjected to heat treatment at 950° C. in a furnace under inert gas over the course of 30 min.

The thickness and the specific ohmic resistivity of the silicon layer were measured as in comparative example 1. The layer was 140 nm thick and had a specific ohmic resistivity of 10 Ω·cm.

Figure 1:
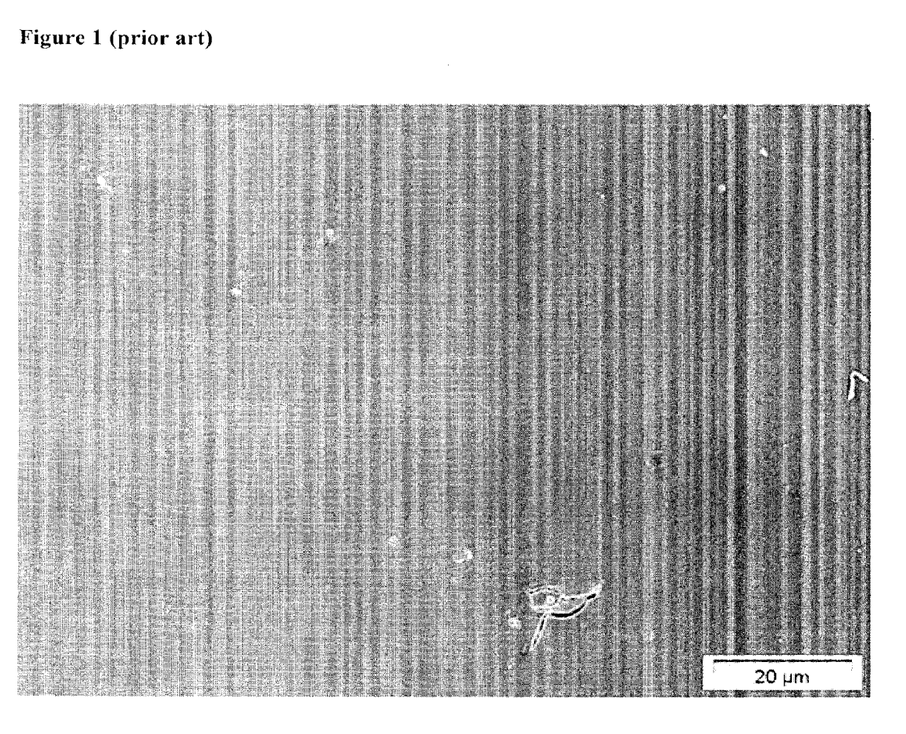
FIG. 1 is a scanning electron microscope (SEM) image showing that a layer partly covering a substrate was predominantly smooth and had cracks in edge zones.

Analysis in a scanning electron microscope (SEM) showed that the layer partly covering the substrate was predominantly smooth and had cracks in the edge zones. The SEM image is shown in FIG. 1.

Figure 2:
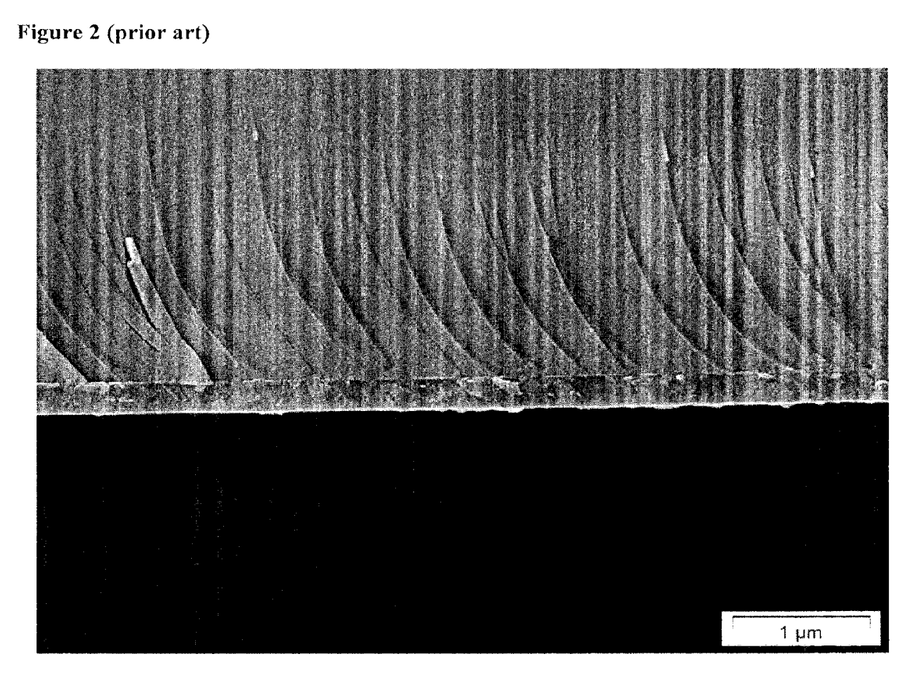
FIG. 2 is an SEM image of a fracture edge showing a silicon layer with a thickness of 200 nm.

Using the SEM image of a fracture edge shown in FIG. 2, a thickness of the silicon layer of 200 nm was found, which agreed with the abovementioned profilometer measurement within the accuracy of measurement. The profilometer used was a KLA Tencor instrument, instrument type P15 from KLA-Tencor Corporation, Film and Surface Technology, 160 Rio Robles, San Jose, Calif. USA 951 34.

Example 1

Undoped Layer

In a glovebox with an argon atmosphere, the production, described in comparative example 1, of a mixture of oligomeric and monomeric cyclopentasilane by UV irradiation was repeated. The oligomeric proportion had a weight-average molecular weight $M_w$ of 2500 g/mol, measured by means of GPC.

The mixture was first diluted with toluene such that the mixture of one part by weight of silane and 2 parts by weight of toluene was obtained. Thereafter, 1 part by weight of a solution of 0.25 g of polystyrene in 5 g of toluene was added, such that the mixture now comprised 1 part by weight of silane, 2.95 parts by weight of toluene and 0.05 part by weight of polystyrene. The polystyrene was a commercial product from Ineos Nova with a weight-average molecular weight Mw=180 000 g/mol, which was purified by reprecipitation in toluene/methanol before use.

A spin-coater was used to apply the inventive liquid silane formulation to a pre-cleaned quartz blank of size 2.5 cm·2.5 cm. No contraction of the wet layer after the coating process was observed. Subsequently, a hotplate was used to heat the layer to 500° C. The result was a dark silicon layer which covered 100% of the glass blank.

The inventive layer thus obtained was subjected to heat treatment at 950° C. in a furnace under inert gas for 30 min. The thickness of the layer now obtained was measured as in comparative example 1 and was 280 nm.

The specific ohmic resistivity was measured with a Hewlett Packard P 4156A Analyser and was above $10^7$ Ω·cm.

Example 2 n-Doped Layer

Example 1 was carried out, but with the difference that a cooligomer of phenylphosphine and cyclopentasilane with a weight-average molecular weight Mw=2200 g/mol was added as a dopant in the step of toluene dilution of the mixture of the oligomer of cyclopentasilane, monomeric cyclopentasilane and polystyrene.

A spin-coater was used to apply this inventive formulation to a pre-cleaned quartz blank of size 2.5 cm·2.5 cm. The wet film which was then obtained was subsequently heated to 500° C. with the aid of a hotplate. The result was a dark silicon layer. This layer was subsequently subjected to heat treatment at 950° C. in a furnace under inert gas over the course of 30 min.

The thickness of the layer now obtained was measured as in comparative example 1 and was 350 nm.

The specific ohmic resistivity of this layer was measured as in comparative example 1 and was 11 Ω·cm.

Figure 3:
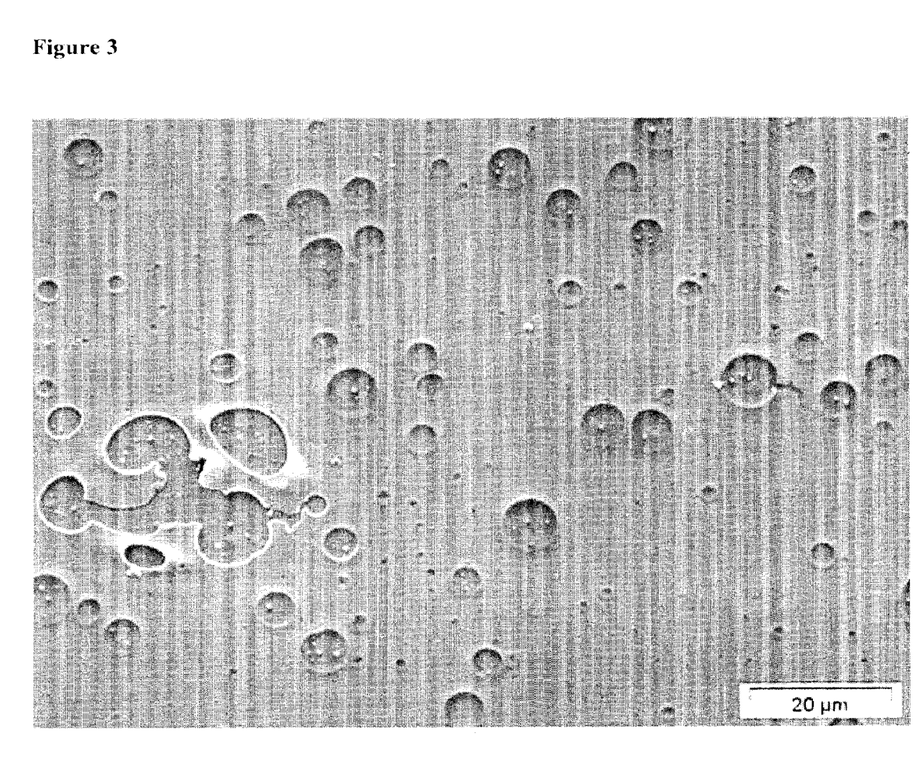
FIG. 3 is an SEM image showing an inventive, complete silicon layer with crater-like structuring with typical diameters of 0.5 to 5 µm.

Analysis in a scanning electron microscope (SEM) showed that the inventive silicon layer was complete and had crater-like structuring with typical diameters of 0.5 to 5 μm, shown in FIG. 3. The structuring was distributed virtually homogeneously over the surface, meaning that the inventive silicon layer did not have any smooth surfaces.

Figure 4:
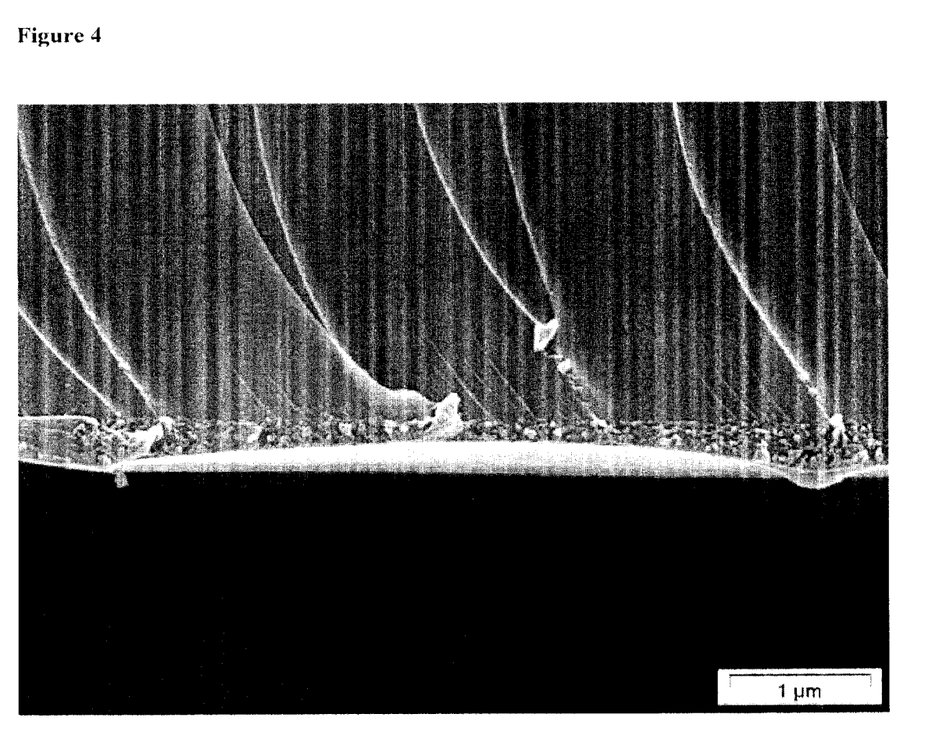
FIG. 4 is an SEM image of a fracture edge showing a layer thickness of 380 nm.

The SEM image of a fracture edge, shown in FIG. 4, showed a layer thickness of 380 nm, which agreed with the abovementioned profilometer measurement within the accuracy of measurement. Owing to the structuring, the measurement by means of a profilometer gave a mean measurement. In the creation of the SEM image, a thick site was sought, and not the depression of a crater-like structure, where the silicon layer was thinner.

The image of the fracture edge also shows that the flat crater-like depressions were neither holes nor cracks in the inventive silicon layer, and the inventive silicon layer instead fully covered the substrate.

Example 3 p-Doped Layer

Example 1 was carried out, but with the difference that a cooligomer of decaborane(14) and cyclopentasilane with a weight-average molecular weight Mw=2500 g/mol was added as a dopant in the toluene dilution of the mixture of the oligomer of the cyclopentasilane and of the monomeric cyclopentasilane.

A spin-coater was used to apply this inventive formulation to a pre-cleaned quartz blank of size 2.5 cm·2.5 cm. The substrate and the wet film now obtained were subsequently heated to 500° C. with the aid of a hotplate. This gave a dark silicon layer. The inventive silicon layer was subsequently subjected to heat treatment at 950° C. in a furnace under inert gas over the course of 30 min.

The thickness of the layer now obtained was measured as in comparative example 1 and was 260 nm.

The specific ohmic resistivity of this layer was as measured in comparative example 1 and was 0.1 Ω·cm.

Figure 5:
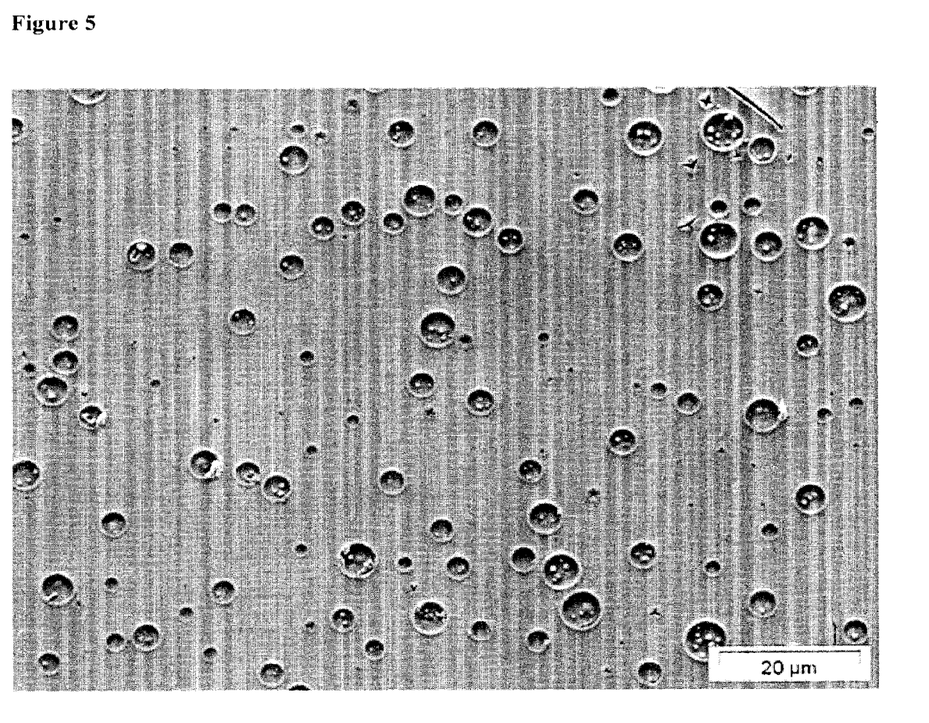
FIG. 5 is an SEM image showing an inventive, complete silicon layer with crater-like structuring with typical diameters of 0.5 to 5 µm.

Analysis in a scanning electron microscope (SEM) showed that the inventive silicon layer was complete and had crater-like structuring with typical diameters of 0.5 to 5 μm, shown in FIG. 5. The structuring was distributed virtually homogeneously over the surface, meaning that the inventive silicon layer did not have any smooth surfaces.

Figure 6:
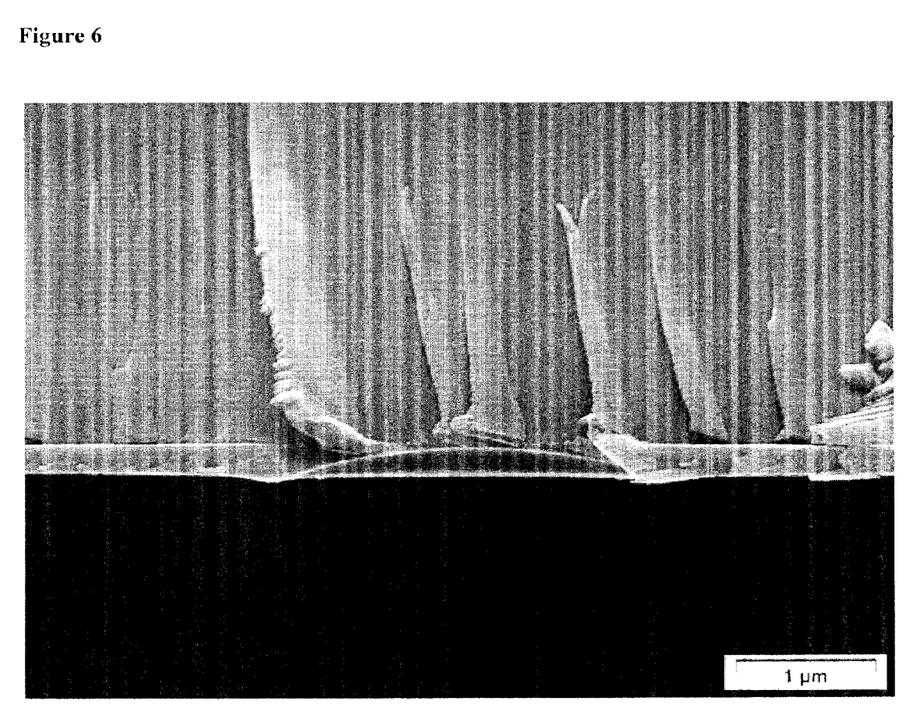
FIG. 6 is an SEM image of a fracture edge, showing a layer thickness of 250 nm.

In an SEM image of a fracture edge, shown in FIG. 6, a layer thickness of 250 nm was found, which agreed with the abovementioned profilometer measurement within the accuracy of measurement.

The image of the fracture edge also showed that the flat crater-like depressions were neither holes nor cracks in the inventive silicon layer, and this silicon layer instead fully covered the substrate.

The invention claimed is:

1. A liquid silane formulation, comprising a reaction product of:
   (A) a silane of either of formulas $Si_nR_{2n+2}$ or $Si_nR_{2n}$, and (B) a high molecular weight carbon polymer miscible with (A),
   wherein a proportion of (B) is from 0.001 to 15% by weight, based on a mass of silicon in (A),
   wherein (B) is a copolymer, a linear polymer, or a combination thereof,
   wherein (B) comprises a main chain, comprising a —C—C-bond, a ring, a heteroatom, a heterocycle, or a combination thereof,
   wherein (B) comprises a subgroup selected from the group consisting of a saturated polymer, a polyacrylate, a methacrylate, a polyvinyl, a polyvinyl ketone, a polyvinyl ether, a polystyrene, or a combination thereof, and
   each R is independently H, halogen, or organyl.

2. The formulation of claim 1, further comprising:
   (C) a room temperature liquid hydrocarbon as a solvent.

3. The formulation of claim 2, wherein the liquid hydrocarbon is an aliphatic hydrocarbon, an aromatic hydrocarbon, or a combination thereof.

4. The formulation of claim 1, wherein 3≤n≤1000.

5. The formulation of claim 1, further comprising:
   (D) a dopant.

6. The formulation of claim 1, wherein a viscosity of the formulation is from 10 to 20,000 mPa·s.

7. A process for producing a silicon layer on a substrate, the process comprising:
   applying the formulation of claim 1 to the substrate, and
   introducing electromagnetic energy, thermal energy, or both, thereby decomposing the high molecular weight carbon polymer at least partly to monomers and driving the monomers at least partly out of the formulation, to obtain an at least partly polymorphic silicon layer.

8. The process of claim 7, further comprising:
heating the at least partly polymorphic silicon layer to a temperature of from 300 to 1000° C. after introducing the electromagnetic energy, thermal energy or both, and then
cooling the layer.

9. The formulation of claim 1,
wherein, if (A) is of formula $$Si_nH_{2n+2},$$

then $3 \leq n \leq 10$;
and wherein, if (A) is of formula $$Si_nH_{2n},$$

then $4 \leq n \leq 8$.

10. The formulation of claim 1, wherein the high molecular weight carbon polymer is capable of decomposing substantially to monomers, volatile fragments, or both, when introduced to electromagnetic energy, thermal energy, or both.

11. The formulation of claim 1,
wherein (B) is a linear polymer comprising a main chain, and
the main chain comprises a —C—C-bond and a subgroup of an unsaturated polymer.

12. The formulation of claim 1,
wherein (B) comprises a polyester, a main chain comprising a ring or a heterocycle, a polyanhydride, a polysulphide, a polysulphone, a polyamide, or a combination thereof.

* * * * *